(12) United States Patent
Mamba et al.

(10) Patent No.: US 11,955,166 B2
(45) Date of Patent: Apr. 9, 2024

(54) APPARATUSES AND METHODS FOR SIGNAL TRANSMISSION PRECONDITIONING

(71) Applicant: MICRON TECHNOLOGY, INC., Boise, ID (US)

(72) Inventors: Atsushi Mamba, Sagamihara (JP); Tetsuya Arai, Sagamihara (JP); Guangcan Chen, Machida (JP)

(73) Assignee: Micron Technology, Inc., Boise, ID (US)

( * ) Notice: Subject to any disclaimer, the term of this patent is extended or adjusted under 35 U.S.C. 154(b) by 160 days.

(21) Appl. No.: 17/749,563

(22) Filed: May 20, 2022

(65) Prior Publication Data

US 2023/0377631 A1 Nov. 23, 2023

(51) Int. Cl.
*G11C 7/00* (2006.01)
*G11C 11/4076* (2006.01)
*G11C 11/4093* (2006.01)

(52) U.S. Cl.
CPC ...... *G11C 11/4093* (2013.01); *G11C 11/4076* (2013.01)

(58) Field of Classification Search
CPC ... G11C 7/1006; G11C 7/1018; G11C 7/1051; G06F 5/10; G06F 5/00
USPC ................................................ 365/221, 194
See application file for complete search history.

(56) References Cited

U.S. PATENT DOCUMENTS 7,196,545 B1* 3/2007 Groen .................... H03K 3/356
326/46
2014/0016404 A1* 1/2014 Kim ...................... G11C 11/165
365/158

* cited by examiner

*Primary Examiner* — Son T Dinh
(74) *Attorney, Agent, or Firm* — Dorsey & Whitney LLP

(57) ABSTRACT

Embodiments of the disclosure include signal processing methods to precondition signals for transmission on a high speed bus. A preconditioning circuit is configured to receive a serialized data signal at an input node and to precondition the serialized output data signal to provide a preconditioned output signal at an output node. The pre-conditioning circuit may include a feedback circuit coupled between the input node and the output node that is configured to independently control both of a propagation delay between the output node and the input node and a magnitude of emphasis/de-emphasis applied to a signal at the output node for provision to the input node.

23 Claims, 6 Drawing Sheets

APPARATUSES AND METHODS FOR SIGNAL TRANSMISSION PRECONDITIONING

BACKGROUND

High data reliability, high speed of memory access, lower power consumption and reduced chip/package size are features that are demanded from semiconductor memory. Speed of data transmission on high speed signal lines may be limited by a speed at which driver circuitry can transition between opposite logical values as data is transmitted. Higher speed data transmissions are also more susceptible to signal jitter introduced at data terminals Most solutions implemented to improve driver circuit transition performance results in increased power consumption. The increased speed at the expense of increased power consumption becomes an undesirable tradeoff, especially in low power architectures.

DETAILED DESCRIPTION

Figure 1:
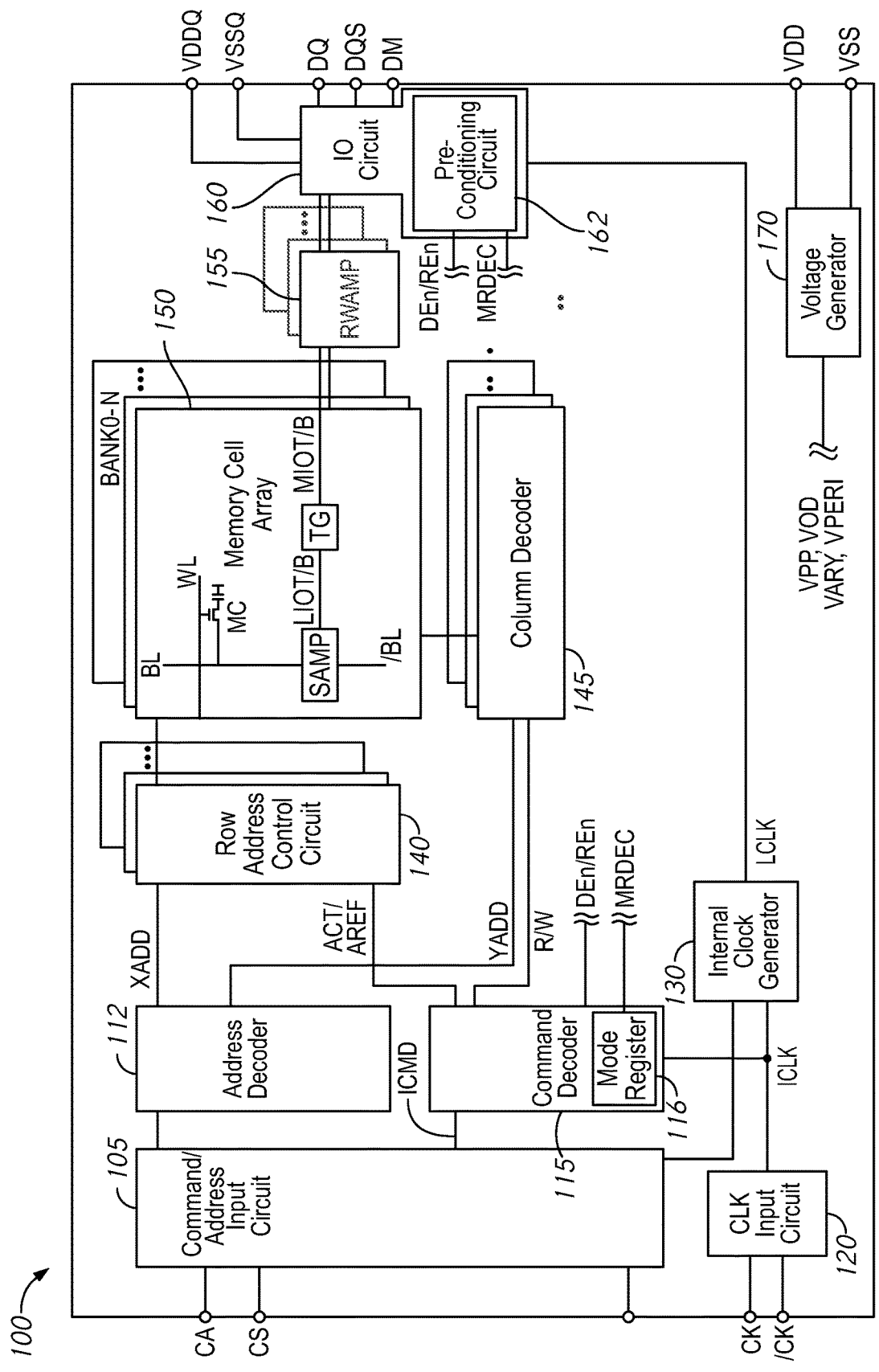
FIG. 1 is a block diagram of a semiconductor device according to an embodiment of the present disclosure.

This disclosure describes signal processing methods to increase data throughput by pre-conditioning a signal for transmission via use of signal pre-conditioning circuitry. The pre-conditioning circuitry may include a timing control circuit that controls timing (e.g., an amount of delay) of application of the signal preconditioning to the signal and a magnitude control circuit that controls a magnitude of the preconditioning (e.g., an amount of emphasis or de-emphasis) applied to the signal. The signal pre-conditioning circuitry may be implemented as a feedback loop within the driver circuit that is preconditioning a current value on an input signal based at least in part on a current value of the output signal, which may be an inverted version of the preceding value of the input signal.

The timing control circuit may be configured to selectively set or adjust an amount of delay applied in the feedback loop between the output signal node and the input signal node. The amount of delay may be set based on a clock speed of the data transmission. In some examples, the delay may be set to approximate a width of one unit of information (e.g., width of one data bit transmitted on the signal line).

The magnitude control circuit may be configured to selectively set or adjust a magnitude of the emphasis or de-emphasis applied in the feedback loop between the output signal node and the input signal node. The magnitude of the emphasis or de-emphasis may also be set based on the clock speed of the data transmission. For example, the magnitude of the emphasis or de-emphasis may be greater for a first clock speed than a second clock speed when the second clock speed is slower than the first clock speed due to the decreased amount of time for transmissions.

In addition, signal lines connected to external data terminals may be affected by signal jitter. The faster data is transmitted, the more susceptible a signal may be to jitter interference due to the smaller unit information time. In some examples, the signal pre-conditioning circuitry may be implemented such that it introduces a jitter waveform that is inverse to a jitter waveform introduced at the external terminal. The preconditioning circuitry described herein may reduce power consumption and improve reliability for high-speed data transmissions as compared with conventional solutions.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

FIG. 1 is a block diagram of a semiconductor device 100 according to at least one embodiment of the disclosure. The semiconductor device 100 may be a semiconductor memory device, such as a dynamic, random-access memory (DRAM) device (e.g., double data rate (DDR) 4 DRAM, DDR5 DRAM, DDR6 DRAM, etc.) integrated on a single semiconductor chip. The semiconductor device 100 may include a clock input circuit 120, an internal clock generator 130, an address command input circuit 105, an address decoder 112, a command decoder 115, a plurality of row decoders 140, a memory cell array 150 including sense amplifiers SAMP and transfer gates TG, a plurality of column decoders 145, a plurality of read/write amplifiers 155, an input/output (I/O) circuit 160, and a voltage generator 170. The semiconductor device 100 may include a plurality of external terminals including address and command terminals CA and CS coupled to command/address bus 110, clock terminals CK and /CK, data terminals DQ, DQS, and DM, and power supply terminals VDD, VSS, VDDQ, and VSSQ. The semiconductor device 100 may be mounted on a substrate, for example, a memory module substrate, a mother board or the like.

The semiconductor device 100 includes a memory array 150. The memory array 150 is shown as including a plurality of memory banks. In the embodiment of FIG. 1, the memory array 150 is shown as including N+1 memory banks BANK0-N, where N is any integer value, such as 2, 4, 8, 16, 32, etc. Each of the memory banks BANK0-N may include a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 140 and the selection of the bit lines BL and /BL is performed by a column decoder 145. In the embodiment of FIG. 1, the row decoder 140 includes a respective row decoder 140 for each memory bank BANK0-N and the column decoder 145 includes a respective column decoder 145 for each memory bank BANK0-N. The bit lines BL and /BL are coupled to a respective sense amplifier (SAMP). Read data from the bit line BL or /BL is amplified by the sense amplifier SAMP, and transferred to read/write amplifiers 155 over complementary local data lines (LIOT/B), transfer gate (TG), and complementary main data lines (MIOT/B). Conversely, write data outputted from the read/write amplifiers 155 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address terminals CA coupled to a command and address bus to receive commands and addresses, and a CS signal, clock terminals to receive clocks CK and /CK, data terminals DQ to receive and provide channel data (e.g., via a multi-signal line channel data bus), and power supply terminals to receive power supply potentials VDD, VSS.

The clock terminals are supplied with external clocks CK and /CK that are provided to an input circuit 120. The external clocks may be complementary. The input circuit 120 generates an internal clock ICLK based on the CK and /CK clocks. The ICLK clock is provided to the command decoder 115 and to an internal clock generator 130. The internal clock generator 130 provides various internal clocks LCLK based on the ICLK clock. The LCLK clocks may be used for timing operation of various internal circuits. The internal data clocks LCLK are provided to the input/output circuit 160 to time operation of circuits included in the input/output circuit 160, for example, to data receivers to time the receipt of write data.

The CA terminals may be supplied with memory addresses. The memory addresses supplied to the CA terminals are transferred, via a command/address input circuit 105, to an address decoder 112. The address decoder 112 receives the address and supplies a decoded row address XADD to the row decoder 140 and supplies a decoded column address YADD to the column decoder 145. The address decoder 112 may also supply a decoded bank address BADD, which may indicate the bank of the memory array 150 containing the decoded row address XADD and column address YADD. In some embodiments, the address decoder 112 may also indicate a particular memory die of the stack of memory dies for activation. The CA terminals may be supplied with commands Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 105. The command decoder 115 includes circuits to decode the internal command signals to generate various internal signals and commands for performing operations. For example, the command decoder 115 may provide a row command signal to select a word line and a column command signal to select a bit line.

The semiconductor device 100 may receive an access command which is a read command. When a read command is received, and a bank address, a row address and a column address (and optional die address) are timely supplied with the read command, read data is read from memory cells in the memory array 150 corresponding to the row address and column address. The read command is received by the command decoder 115, which provides internal commands so that read data from the memory array 150 is provided to the read/write amplifiers 155. The read data is output to outside from the data terminals DQ via the input/output circuit 160.

The semiconductor device 100 may receive an access command which is a write command. When the write command is received, and a bank address, a row address and a column address (and optional die address) are timely supplied with the write command, write data supplied to the data terminals DQ is written to a memory cells in the memory array 150 corresponding to the row address and column address. The write command is received by the command decoder 115, which provides internal commands so that the write data is received by data receivers in the input/output circuit 160. Write clocks may also be provided to the external clock terminals for timing the receipt of the write data by the data receivers of the input/output circuit 160. The write data is supplied via the input/output circuit 160 to the read/write amplifiers 155, and by the read/write amplifiers 155 to the memory array 150 to be written into the memory cell MC.

In some examples, the input/output circuit 160 may include a respective transmitter and/or a respective receiver coupled to each of the data terminals DQ. The transmitters may be configured to transmit read data to the channel data bus via the data terminals DQ and the receivers may be configured to receive write data from the channel data bus via the data terminals DQ. The channel data bus may include multiple signal lines. The channel bus may facilitate communication of channel data between the semiconductor device 100 and an external device, such as a memory module controller, a memory controller, another semiconductor device, a processor, or any other semiconductor device.

In some examples, the transfer of data from the input/output circuit 160 to the data terminals DQ may occur at high speeds. When read data is received at the input/output circuit 160, the data may be re-arranged for transmission over the data terminals DQ. For example, the internal bus providing the read data from the read/write amplifiers 155 may be wider than the data terminal bus DQ. Thus, a block of read data received in parallel (e.g., contemporaneously) from the read/write amplifiers 155 may be split into smaller portions that are serially transmitted from the data terminals DQ to reduce the number of bits transmitted in parallel at one time to a width of the data terminal DQ bus. Serializing the smaller portions of data may result in a respective subset of individual bits of the read data being transmitted sequentially over each DQ terminal.

To improve reliability of and reduce power consumption for transmission of the serialized read data to each data terminal, the input/output circuit 160 may include a preconditioning circuit 162. The pre-conditioning circuit 162 may increase data throughput by pre-conditioning a data signal for transmission. The pre-conditioning circuit 162 may include a timing control circuit that controls timing (e.g., an amount of delay) of application of the signal preconditioning to the signal and a magnitude control circuit that controls a magnitude of the preconditioning (e.g., an amount of emphasis or de-emphasis) applied to the signal. The pre-conditioning circuit 162 may be implemented as a feedback loop within the driver circuitry of the input/output circuit 160 that preconditions a current value on an input signal received from a serializer based at least in part on a current value of an output signal provided to downstream signal drivers. The output signal may be an inverted version of the preceding value of the input signal. The pre-conditioning circuit 162 may be enabled via control signals, such as a read enable signal REn and a de-emphasis enable signal DEn from the command decoder 115.

The timing control circuit of the pre-conditioning circuit 162 may be configured to selectively set or adjust an amount of delay applied in the feedback loop between the output signal node and the input signal node. The amount of delay may be set based on a clock speed of the data transmission. In some examples, the delay may be set to approximate a width of one unit of information (e.g., width of one data bit transmitted on the signal line). In some examples, the delay amount of the timing control circuit of the pre-conditioning circuit 162 may configured via a mode register de-emphasis code signal MRDEC provided from a mode register 116 of the command decoder 115. The MRDEC code may be set in the mode register 116 via a mode register set command received from an external terminal. The value of the MRDEC signal may be based on a clock speed designated for the data bus.

The magnitude control circuit of the pre-conditioning circuit 162 may be configured to selectively set or adjust a magnitude of the emphasis or de-emphasis applied in the feedback loop between the output signal node and the input signal node. The magnitude of the emphasis or de-emphasis may also be set based on the clock speed of the data transmission. For example, the magnitude of the emphasis or de-emphasis may be greater for a first clock speed than a second clock speed when the second clock speed is slower than the first clock speed due to the decreased amount of time for transmissions. In some examples, the magnitude of the emphasis or de-emphasis applied by the magnitude control circuit of the pre-conditioning circuit 162 may configured via the MRDEC signal provided from the mode register 116.

In addition, the data terminals DQ may be affected by signal jitter. In some examples, the pre-conditioning circuit 162 may be implemented such that it introduces a jitter waveform that is inverse to a jitter waveform introduced at the data terminals DQ. The pre-conditioning circuit 162 described herein may reduce power consumption and improve reliability for high-speed data transmissions as compared with conventional solutions.

The power supply terminals are supplied with power supply potentials VDD and VSS. The power supply potentials VDD and VSS are supplied to an internal voltage generator circuit 170. The internal voltage generator circuit 170 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 150, and the internal potential VPERI is used in many peripheral circuit blocks.

Figure 2:
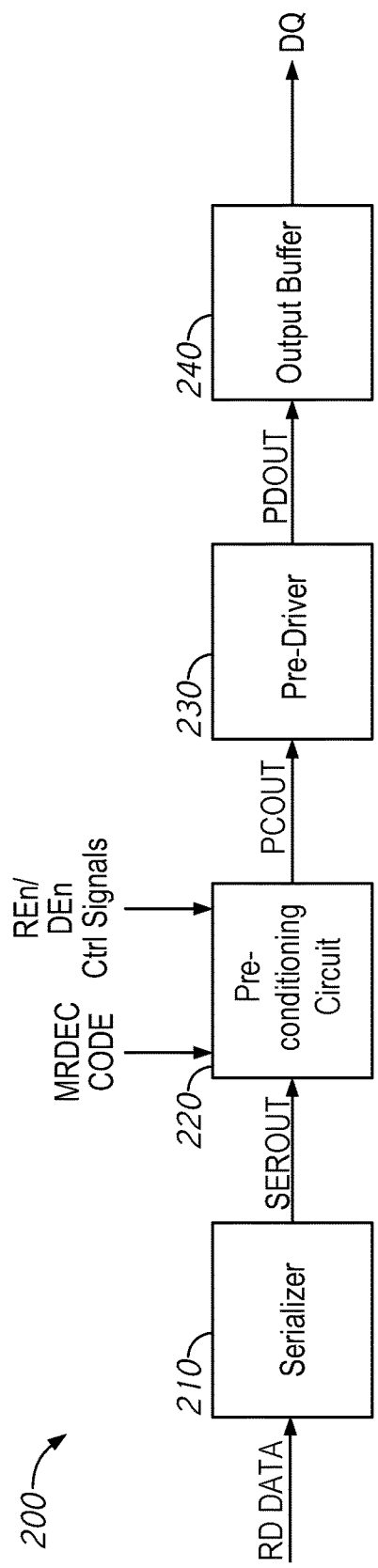
FIG. 2 is a block diagram of a portion of an IO circuit according to an embodiment of the present disclosure.

FIG. 2 is a block diagram of a portion of an IO circuit 200 according to an embodiment of the present disclosure. The input/output circuit 160 of FIG. 1 may implement the IO circuit 200, in some examples. The IO circuit 200 may include a serializer 210, a pre-conditioning circuit 220, a pre-driver 230, and an output buffer 240.

The serializer 210 may be configured to receive read data RD DATA from a memory cell array (e.g., the memory cell array 150 of FIG. 1) during a read operation, and to serialize the RD DATA to provide serialized output data signals SEROUT encoded with portions of the read data.

The pre-conditioning circuit 220 may be configured to receive the SEROUT data and to provide pre-conditioned output signals PCOUT based on the SEROUT signals. The PCOUT signals may be encoded with the same data as the SEROUT signals. When preconditioning is enabled via the REn (e.g., indicating a read operation) and DEn (e.g., indicating that preconditioning is enabled) control signals, the pre-conditioning circuit 220 may be configured to precondition the SEROUT signals based on the MRDEC signal to provide the PCOUT signals. The REn and DEn control signals may be provided from a command decoder (e.g., the command decoder 115 of FIG. 1) and the MRDEC signals may be provided from a mode register (e.g., the mode register 116 of FIG. 1).

The pre-driver 230 may adjust a voltage of the PCOUT signals for driving the signal to the data terminal DQ to provide a pre-driver output signals PDOUT. The output buffer 240 may receive the PDOUT signals and may provide the data encoded in the PDOUT signals to the output terminal DQ. The pre-driver 230 and the output buffer 240 may stage data-encoded signals for output onto a data bus coupled to the DQ terminals. The data bus may operate at a different voltage and clock than the internal circuitry of the input/output circuit IO circuit 200, and as such, the pre-driver 230 and the output buffer 240 may transition the data-encoded signal to voltage levels and clock timing of the data bus.

In operation, the transfer of data from the input/output circuit IO circuit 200 to the data terminals DQ may occur at high speeds. When the RD DATA is received at the input/output circuit IO circuit 200, the data may be re-arranged for transmission over the data terminals DQ. For example, the internal bus providing the RD DATA from the memory cell array may be wider than the data terminal bus DQ. Thus, the block of RD DATA is received in parallel (e.g., contemporaneously) at the serializer 210 may be split into smaller portions in order to be serially transmitted from the data terminals DQ to reduce the number of bits transmitted in parallel at one time to a width of the data terminal DQ bus. The serializer 210 may serialize the RD DATA to provide the SEROUT signals encoded with the RD DATA. Serializing the RD DATA into smaller portions of data may result in a respective subset of individual bits of the read data being transmitted sequentially over each DQ terminal.

To improve reliability of and reduce power consumption for transmission of the serialized read data to each data terminal, the pre-conditioning circuit 220 may be configured to precondition the SEROUT signals to provide the PCOUT signals to increase data throughput. The pre-conditioning circuit 220 may include a timing control circuit that controls timing (e.g., an amount of delay) of application of the signal preconditioning to the signal and a magnitude control circuit that controls a magnitude of the preconditioning (e.g., an amount of emphasis or de-emphasis) applied to the signal. The IO circuit 200 may be implemented using a feedback loop that preconditions a current value on the SEROUT signals received from the serializer 210 based at least in part on a current value of the PCOUT signals provided to the pre-driver 230. The feedback loop may use an inverted version of the preceding value of the SEROUT signals. The pre-conditioning circuit 220 may be enabled via the REn and DEn signals (e.g., received from a command decoder).

The timing control circuit of the pre-conditioning circuit 220 may be configured to selectively set or adjust an amount of delay applied in the feedback loop between the output signal node and the input signal node. The amount of delay may be set based on a clock speed of the data transmission. In some examples, the delay may be set to approximate a width of one unit of information (e.g., width of one data bit transmitted on the signal line). In some examples, the delay amount of the timing control circuit of the pre-conditioning circuit 220 may configured via the MRDEC signal provided from a mode register. The MRDEC code may be set in the mode register. The value of the MRDEC signal may be based on a clock speed designated for the data bus.

The magnitude control circuit of the pre-conditioning circuit 220 may be configured to selectively set or adjust a magnitude of the emphasis or de-emphasis applied in the feedback loop between the output signal node and the input signal node. The magnitude of the emphasis or de-emphasis may also be set based on the clock speed of the data transmission. For example, the magnitude of the emphasis or de-emphasis may be greater for a first clock speed than a second clock speed when the second clock speed is slower than the first clock speed due to the decreased amount of time for transmissions. In some examples, the magnitude of the emphasis or de-emphasis applied by the magnitude control circuit of the pre-conditioning circuit 220 may configured via the MRDEC signal provided from the mode register.

In addition, the data terminals DQ may be affected by signal jitter. In some examples, the pre-conditioning circuit 220 may be implemented such that it introduces a jitter waveform that is inverse to a jitter waveform introduced at the data terminals DQ.

The pre-driver 230 may adjust the voltage and/or timing of the PCOUT signals for driving the signal to the data terminals DQ to provide the PDOUTs. The output buffer 240 may receive the PDOUT signals and may provide the data encoded in the PDOUT signals to the output terminal DQ.

The pre-conditioning circuit 220 described herein may reduce power consumption and improve reliability for high-speed data transmissions as compared with conventional solutions.

Figure 3:
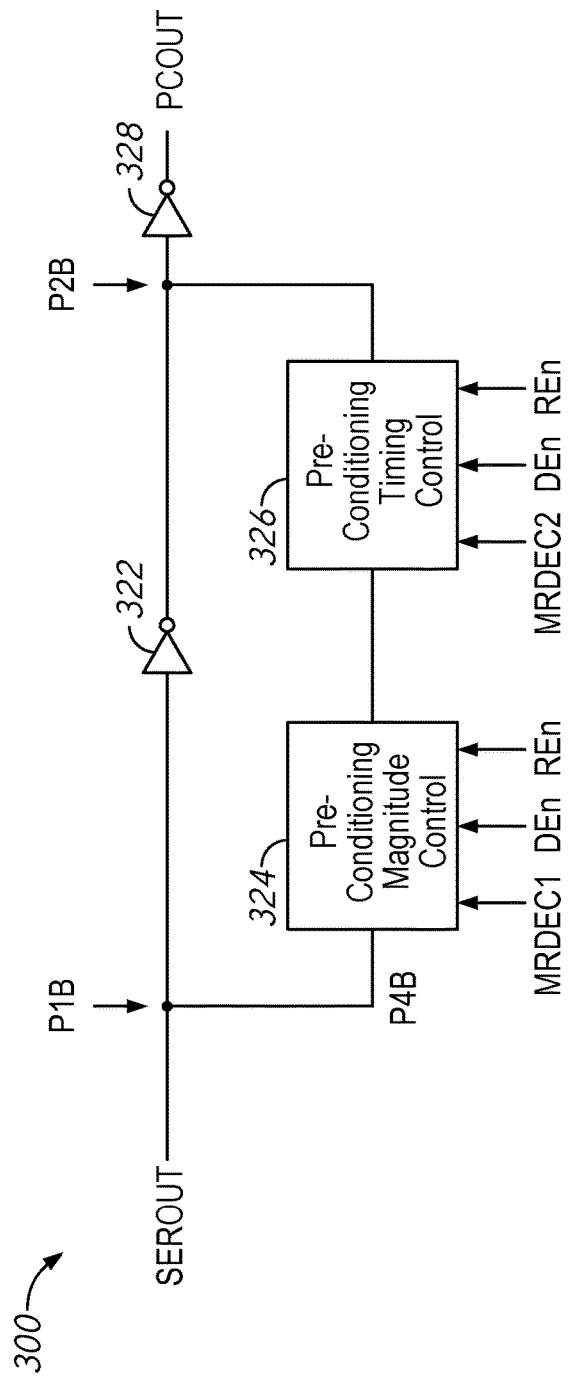
FIG. 3 is a block diagram of a pre-conditioning circuit according to an embodiment of the present disclosure.

FIG. 3 is a block diagram of a pre-conditioning circuit 300 according to an embodiment of the present disclosure. The pre-conditioning circuit 162 of FIG. 1 and/or the pre-conditioning circuit 220 of FIG. 2 may implement the pre-conditioning circuit 300, in some examples. The pre-conditioning circuit 300 may include inverters 322 and 328, and a feedback loop including a pre-conditioning magnitude control circuit 324 and a pre-conditioning timing control circuit 326.

Serialized output data signals SEROUT may be received at an input node P1B and may be provided to an output node P2B via the inverter 328. The SEROUT signals may be encoded with read data from a memory cell array. The preconditioned output signals PCOUT signals may be provided at an output of the pre-conditioning circuit 300 via the inverter 328.

When preconditioning is enabled via the REn (e.g., indicating a read operation) and DEn (e.g., indicating that preconditioning is enabled) control signals, the pre-conditioning magnitude control circuit 324 and the pre-conditioning timing control circuit 326 may be configured to precondition the SEROUT signals based on the MRDEC1 and MRDEC2 signals, respectively, to provide the PCOUT signals. The REn and DEn control signals may be provided from a command decoder (e.g., the command decoder 115 of FIG. 1) and the MRDEC signals may be provided from a mode register (e.g., the mode register 116 of FIG. 1).

In operation, the pre-conditioning circuit 300 may be configured to precondition the SEROUT signals for consumption by downstream circuitry in high-throughput applications to improve reliability of and reduce power consumption for transmission of the serialized read data to each data terminal. As part of the preconditioning, when enabled via the REn and DEn signals (e.g., received from a command decoder), the pre-conditioning timing control circuit 326 may control timing (e.g., an amount of delay) of application of the signal preconditioning to the signal and the pre-conditioning magnitude control circuit 324 may control a magnitude of the preconditioning (e.g., an amount of emphasis or de-emphasis) applied to the signal. The pre-conditioning magnitude control circuit 324 and the pre-conditioning timing control circuit 326 may be implemented using a feedback loop that preconditions a current value of the SEROUT signals at the P1B node based at least in part on a current value of signals at the P2B node. The value at the P2B node may include an inverted version of the preceding value of the SEROUT signals at the P1B node.

The pre-conditioning timing control circuit 326 may be configured to selectively set or adjust an amount of delay applied in the feedback loop between the P2B node and the P1B node. The amount of delay may be set based on a clock speed of the data transmission. In some examples, the delay may be set to approximate a width of one unit of information (e.g., width of one data bit transmitted on the signal line). In some examples, the delay amount of the pre-conditioning timing control circuit 326 may configured via the MRDEC2 signal provided from a mode register. The MRDEC2 code may be set in the mode register. The value of the MRDEC2 signal may be based on a clock speed designated for an output data bus.

The pre-conditioning magnitude control circuit 324 may be configured to selectively set or adjust a magnitude of the emphasis or de-emphasis applied in the feedback loop between the P2B node and the P1B node. The magnitude of the emphasis or de-emphasis may also be set based on the clock speed of the data transmission. For example, the magnitude of the emphasis or de-emphasis may be greater for a first clock speed than a second clock speed when the second clock speed is slower than the first clock speed due to the decreased amount of time for transmissions. In some examples, the magnitude of the emphasis or de-emphasis applied by the pre-conditioning magnitude control circuit 324 may configured via the MRDEC1 signal provided from the mode register. The pre-conditioned signal provided from the pre-conditioning magnitude control circuit 324 may be provided to a node P4B coupled to the node P1B.

In addition, the data terminals DQ may be affected by signal jitter. In some examples, the pre-conditioning magnitude control circuit 324 and the pre-conditioning timing control circuit 326 may be implemented such that they introduce a jitter waveform that is inverse to a jitter waveform introduced at the external data terminals.

Figure 4A:
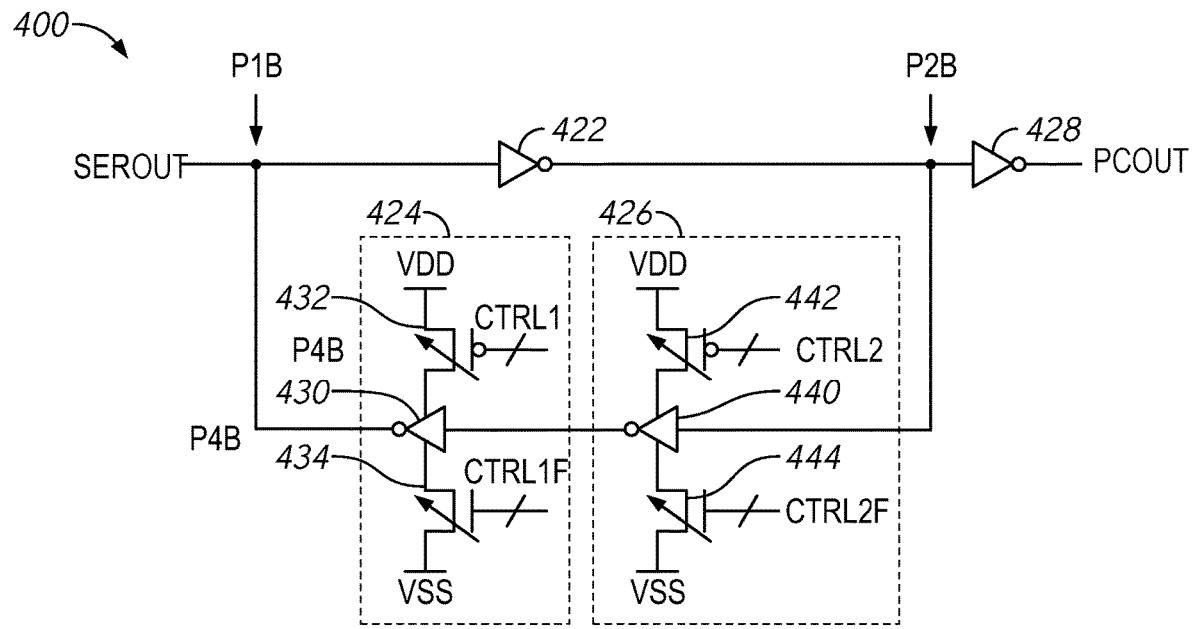
FIG. 4A is a block diagram of a pre-conditioning circuit according to an embodiment of the present disclosure.

FIG. 4A is a block diagram of a pre-conditioning circuit 400 according to an embodiment of the present disclosure. The pre-conditioning circuit 162 of FIG. 1, the pre-conditioning circuit 220 of FIG. 2, and/or the pre-conditioning circuit 300 of FIG. 3 may implement the pre-conditioning circuit 400, in some examples. The pre-conditioning circuit 400 may include inverters 422 and 428, and a feedback loop including a pre-conditioning magnitude control circuit 424 and a pre-conditioning timing control circuit 426.

Serialized output data signals SEROUT may be received at an input node P1B and may be provided to an output node P2B via the inverter 428. The SEROUT signals may be encoded with read data from a memory cell array. The preconditioned output signals PCOUT signals may be provided at an output of the pre-conditioning circuit 400 via the inverter 428.

When preconditioning is enabled via the REn (e.g., indicating a read operation) and DEn (e.g., indicating that preconditioning is enabled) control signals, the pre-conditioning magnitude control circuit 424 and the pre-conditioning timing control circuit 426 may be configured to precondition the SEROUT signals based on the MRDEC1 and MRDEC2 signals, respectively, to provide the PCOUT signals. The REn and DEn control signals may be provided from a command decoder (e.g., the command decoder 115 of FIG. 1) and the MRDEC signals may be provided from a mode register (e.g., the mode register 116 of FIG. 1).

In operation, the pre-conditioning circuit 400 may be configured to precondition the SEROUT signals for consumption by downstream circuitry in high-throughput applications to improve reliability of and reduce power consumption for transmission of the serialized read data to each data terminal. As part of the preconditioning, when enabled via the REn and DEn signals (e.g., received from a command decoder), the pre-conditioning timing control circuit 426 may control timing (e.g., an amount of delay) of application of the signal preconditioning to the signal and the pre-conditioning magnitude control circuit 424 may control a magnitude of the preconditioning (e.g., an amount of emphasis or de-emphasis) applied to the signal. The pre-conditioning magnitude control circuit 424 and the pre-conditioning timing control circuit 426 may be implemented using a feedback loop that preconditions a current value of the SEROUT signals at the P1B node based at least in part on a current value of signals at the P2B node. The value at the P2B node may include an inverted version of the preceding value of the SEROUT signals at the P1B node.

The pre-conditioning timing control circuit 426 may be configured to selectively set or adjust an amount of delay applied in the feedback loop between the P2B node and the P1B node. To adjust the amount of delay, an inverter 440 may be coupled to a first voltage source VDD via a first configurable transistor (or set of parallel-coupled transistors) 442 and to a second voltage source VSS via a second transistor (or set of parallel-coupled transistors) 444. The first and second transistors 442 and 444 may control a speed of transition through the inverter 440 based on the CTRL2 and CTRL2F control signals, respectively. The CTRL2 and the CTRL2F control signals are logically complementary. Thus, in some examples, the CTRL2 and CTRL2F signal magnitudes may be adjusted to adjust a speed of transition of a signal through the inverter 440, in one embodiment. In another embodiment where the first transistor 442 and the second transistor 446 each include a respective set of parallel-coupled transistors, the CTRL2 and CTRL2F signals may each include a set of signals each corresponding to one of the respective set of parallel-coupled transistors, and each individual signal may be controlled to enable or disable the corresponding transistor. The amount of delay applied by the pre-conditioning timing control circuit 426 may be set based on a clock speed of the data transmission. In some examples, the delay may be set to approximate a width of one unit of information (e.g., width of one data bit transmitted on the signal line). The CTRL2 and CTRL2F signals may be set in the mode register, and may be based on a clock speed designated for an output data bus.

The pre-conditioning magnitude control circuit 424 may be configured to selectively set or adjust a magnitude of the emphasis or de-emphasis applied in the feedback loop between the P2B node and the P1B node. To adjust the magnitude of the emphasis or de-emphasis, an inverter 430 may be coupled to a first voltage source VDD via a first configurable transistor (or set of parallel-coupled transistors) 432 and to a second voltage source VSS via a second transistor (or set of parallel-coupled transistors) 434. The first and second transistors 432 and 434 may control the magnitude of the emphasis or de-emphasis of the transition through the inverter 430 based on the CTRL1 and CTRL1F control signals, respectively. The CTRL1 and the CTRL1F control signals may be logically complementary. Thus, in some examples, the CTRL1 and CTRL1F signal magnitudes may be adjusted to adjust magnitude of the emphasis or de-emphasis applied to a signal through the inverter 430, in one embodiment. In another embodiment where the first transistor 432 and the second transistor 434 each include a respective set of parallel-coupled transistors, the CTRL1 and CTRL1F signals may each include a set of signals each corresponding to one of the respective set of parallel-coupled transistors, and each individual signal may be controlled to enable or disable the corresponding transistor. The magnitude of the emphasis or de-emphasis may be set based on the clock speed of the data transmission. For example, the magnitude of the emphasis or de-emphasis may be greater for a first clock speed than a second clock speed when the second clock speed is slower than the first clock speed due to the decreased amount of time for transmissions. In some examples, CTRL1 and CTRL1F signals that control the magnitude of the emphasis or de-emphasis applied by the pre-conditioning magnitude control circuit 424 may be provided from the mode register. The preconditioned signal provided from the pre-conditioning magnitude control circuit 424 may be provided to a node P4B coupled to the node P1B.

In addition, the data terminals DQ may be affected by signal jitter. In some examples, the circuitry of each of the pre-conditioning magnitude control circuit 424 and the pre-conditioning timing control circuit 426 may be implemented such that they introduce a jitter waveform that is inverse to a jitter waveform introduced at the external data terminals.

Figure 4B:
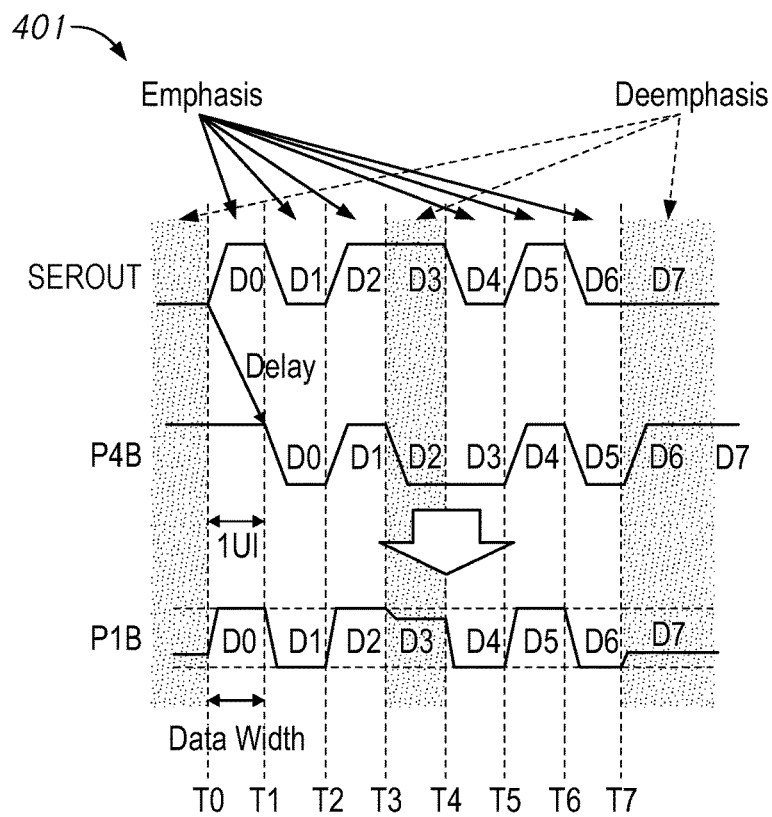
FIG. 4B is an illustration of an exemplary timing diagram depicting operation of a pre-conditioning circuit in accordance with embodiments of the present disclosure.

FIG. 4B is an illustration of an exemplary timing diagram 401 depicting operation of a pre-conditioning circuit in accordance with embodiments of the present disclosure. The timing diagram 401 may illustrate operation of the pre-conditioning circuit 162 of FIG. 1, the pre-conditioning circuit 220 of FIG. 2, the pre-conditioning circuit 300 of FIG. 3, and/or the pre-conditioning circuit 400 of FIG. 4A. The SEROUT signal may correspond to the SEROUT signals of FIGS. 2-4A and the P4B and P1B signals may correspond to the P1B and P4B nodes of FIGS. 3 and 4A.

As shown in the timing diagram 401, the SEROUT signal may be encoded with data D0-D7 to be transmitted starting at time T0. Prior to time T0, the SEROUT signal was set to a logical low value, and accordingly, the P4B signal is set at a logical high value (e.g., based on a value at the P2B node of FIGS. 3 and 4A). Accordingly, the logical high value at the P4B node may cause the logical value at the P1B node driven by the logical low value of the SEROUT signal to be biased or increased from the logical low value. The amount of bias or de-emphasis applied to the P1B node may be controlled by the pre-conditioning magnitude control circuit 324 and/or the pre-conditioning magnitude control circuit 424 of FIGS. 3 and 4A, respectively)

Between times T0 and T1, the D0 data having the logical high value is received on the SEROUT signal. Because the P1B signal is already biased from the logical low value, the energy to transition the P1B node to the logical high value may be reduced as compared with no bias at the P1B node. In addition, because the P4B node is delayed relative to the P1B node (e.g., via the pre-conditioning timing control circuit 326 and/or the pre-conditioning timing control circuit 426 of FIGS. 3 and 4A, respectively), the P4B node remaining at the logical high value may provide an emphasis to the P1B signal to accommodate the transition of the P1B node to the logical high value based on the D0 data.

Between times T1 and T2, the D1 data having the logical low value is received on the SEROUT signal. In addition, the P4B node has a logical low value corresponding to the inverted D0 data. Accordingly, the logical low value from both the SEROUT data and the P4B node may provide an emphasis to the P1B signal to accommodate the transition of the P1B node to the logical low value based on the D1 data.

Between times T2 and T3, the D2 data having the logical high value is received on the SEROUT signal. In addition, the P4B node has the logical high value corresponding to the inverted D1 data. Accordingly, the logical high value from both the SEROUT data and the P4B node may provide an emphasis to the P1B signal to accommodate the transition of the P1B node to the logical high value based on the D2 data.

Between times T3 and T4, the D3 data having the logical high value is received on the SEROUT signal. In addition, the P4B node has the logical low value corresponding to the inverted D2 data. Accordingly, the logical high value from the SEROUT data combined with the logical low value from the P4B node may provide a bias to the signal at the P1B node such that the voltage is slightly lower than the logical high value.

One of skill in the art would understand that operation of the preconditioning circuit for and after times T4-T7 is similar to previously-described operation for times before and between times T0 and T4. Accordingly, in the interest of brevity and conciseness, detailed operation of those time periods is not included.

The timing diagram 401 is exemplary for illustrating operation of various described embodiments. Although the timing diagram 401 depicts a particular arrangement of signal transitions of the included signals, one of skill in the art will appreciate that additional or different transitions may be included in different scenarios without departing from the scope of the disclosure. Further, the depiction of a magnitude of the signals represented in the timing diagram 401 are not intended to be to scale, and the representative timing is an illustrative example of a timing characteristics.

Figure 5:
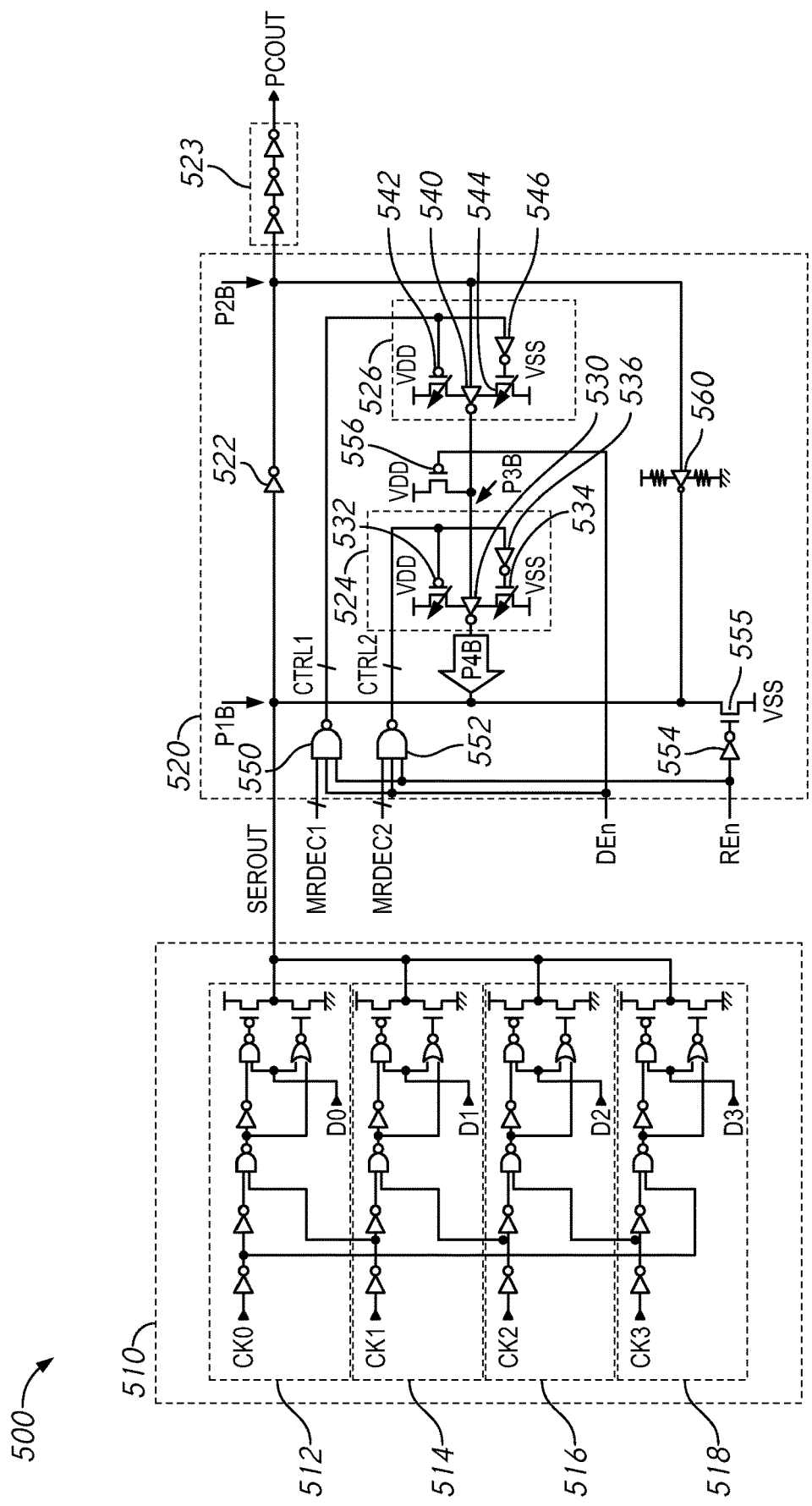
FIG. 5 is a block diagram of an IO circuit according to an embodiment of the present disclosure.

FIG. 5 is a block diagram of an IO circuit 500 according to an embodiment of the present disclosure. The pre-conditioning circuit 162 of FIG. 1 and/or the pre-conditioning circuit 220 of FIG. 2 may implement the IO circuit 500, in some examples. In some examples, the pre-conditioning circuit 300 of FIG. 3 and/or the pre-conditioning circuit 400 of FIG. 4A may be implement at least a portion of the IO circuit 500. The IO circuit 500 may include a serializer 510 coupled to a pre-conditioning circuit 520.

The serializer 510 may be configured to receive read data D0-D3 in parallel from a memory cell array (e.g., the memory cell array 150 of FIG. 1) during a read operation, and to serialize the D0-D3 data to provide a serialized output data signal SEROUT encoded with the D0-D3 data in response to the CK0-CK3 signals, respectively.

The pre-conditioning circuit 520 may be configured to receive SEROUT signal and to precondition the SEROUT signal to provide a preconditioned output signal PCOUT. The pre-conditioning circuit 520 may include inverters 522 and 523, a feedback loop including a pre-conditioning magnitude control circuit 524, a pre-conditioning timing control circuit 526, a precharge transistor 556, and a damper circuit 560. Serialized output data signals SEROUT may be received at an input node P1B and may be provided to an output node P2B via the inverter 522. The SEROUT signals may be encoded with read data from a memory cell array. The preconditioned output signals PCOUT signals may be provided at an output of the IO circuit 500 via the inverter 523.

When preconditioning is enabled via the REn (e.g., indicating a read operation) and DEn (e.g., indicating that preconditioning is enabled) control signals, the pre-conditioning magnitude control circuit 524 and the pre-conditioning timing control circuit 526 may be configured to precondition the SEROUT signals based on the MRDEC1 and MRDEC2 signals, respectively, to provide the PCOUT signals. The REn and DEn control signals may be provided from a command decoder (e.g., the command decoder 115 of FIG. 1) and the MRDEC1/2 signals may be provided from a mode register (e.g., the mode register 116 of FIG. 1).

In operation, the transfer of data from the IO circuit 500 to the data terminals DQ may occur at high speeds. When the read data D0-D3 is received at the IO circuit 500, the data may be re-arranged for transmission over the data terminals. For example, the internal bus providing the read data D0-D3 from the memory cell array may be wider than the data terminal bus. Thus, the block of read data D0-D3 is received in parallel (e.g., contemporaneously) at the serializer 510 may be split into smaller portions in order to be serially transmitted from the data terminals DQ to reduce the number of bits transmitted in parallel at one time to a width of the data terminal DQ bus. The serializer 510 may serialize the read data D0-D3 to provide the SEROUT signals encoded with the read data D0-D3. Serializing the read data D0-D3 into smaller portions of serially-transmitted of data may result in a respective subset of individual bits of the read data being transmitted sequentially over each data terminal.

When no read operation is taking place, the discharge transistor 555 may discharge the P1B node to a low logical value (e.g., the VSS voltage) in response to the REn signal inverted via the inverter 554. In addition, when the preconditioning is disabled via the DEn signal, the precharge transistor 556 may precharge the P3B node to a high logical value (e.g., the VDD voltage), and the NAND gates 550 and 552 may be configured to disable the pre-conditioning timing control circuit 526 and the pre-conditioning magnitude control circuit 524, respectively, by disabling the respective transistors 542, 544, 532, and 534.

During a read operation with preconditioning (e.g., the DEn and REn signals are active), the pre-conditioning circuit 520 may be configured to precondition the SEROUT signals for consumption by downstream circuitry in high-throughput applications to improve reliability of and reduce power consumption for transmission of the serialized read data to each data terminal. As part of the preconditioning, the pre-conditioning timing control circuit 526 may control timing (e.g., an amount of delay) of application of the signal preconditioning to the signal and the pre-conditioning magnitude control circuit 524 may control a magnitude of the preconditioning (e.g., an amount of emphasis or de-emphasis) applied to the signal. The pre-conditioning magnitude control circuit 524 and the pre-conditioning timing control circuit 526 may be implemented using a feedback loop that preconditions a current value of the SEROUT signals at the P1B node based at least in part on a current value of signals at the P2B node. The value at the P2B node may include an inverted version of the preceding value of the SEROUT signals at the P1B node.

The pre-conditioning timing control circuit 526 may be configured to selectively set or adjust an amount of delay applied in the feedback loop between the P2B node and the P1B node based on the MRDEC1 signal provided to the pre-conditioning timing control circuit 526 as the CTRL1 signal via the NAND gate 550. To adjust the amount of delay, an inverter 540 may be coupled to a first voltage source VDD via a first configurable transistor (or set of parallel-coupled transistors) 542 and to a second voltage source VSS via a second transistor (or set of parallel-coupled transistors) 544. The CTRL1 control signal may be configured to adjust a delay through the inverter 540 by controlling a gate voltage of the first and second transistors 542 and 544. The CTRL1 signal may be provided directly to a gate of the first transistor 542 and may be coupled to the gate of the second transistor 544 via an inverter 546. In some examples, the CTRL1 signal magnitude may be adjusted to adjust a speed of transition of a signal through the inverter 540, in one embodiment. In another embodiment where the first transistor 542 and the second transistor 546 each include a respective set of parallel-coupled transistors, the CTRL1 signal may each include a set of signals each corresponding to one of the respective set of parallel-coupled transistors, and each individual signal may be controlled to enable or disable the corresponding transistor. The amount of delay applied by the pre-conditioning timing control circuit 526 may be set based on a clock speed of the data transmission. In some examples, the delay may be set to approximate a width of one unit of information (e.g., width of one data bit transmitted on the signal line). The CTRL1 signal may be set in the mode register, and may be based on a clock speed designated for an output data bus.

The pre-conditioning magnitude control circuit 524 may be configured to selectively set or adjust a magnitude of the emphasis or de-emphasis applied in the feedback loop between the P2B node and the P1B node. To adjust the magnitude of the emphasis or de-emphasis, an inverter 530 may be coupled to a first voltage source VDD via a first configurable transistor (or set of parallel-coupled transistors) 532 and to a second voltage source VSS via a second transistor (or set of parallel-coupled transistors) 534. The CTRL2 control signal may be configured to adjust a magnitude of the emphasis or de-emphasis through the inverter 530 by controlling a gate voltage of the first and second transistors 532 and 534. The CTRL2 signal may be provided directly to a gate of the first transistor 532 and may be coupled to the gate of the second transistor 534 via an inverter 536. In some examples, the CTRL signal magnitude may be adjusted to adjust magnitude of the emphasis or de-emphasis applied to a signal through the inverter 530, in one embodiment. In another embodiment where the first transistor 532 and the second transistor 534 each include a respective set of parallel-coupled transistors, the CTRL1 signal may include a set of signals each corresponding to one of the respective set of parallel-coupled transistors, and each individual signal may be controlled to enable or disable the corresponding transistor. The magnitude of the emphasis or de-emphasis may be set based on the clock speed of the data transmission. For example, the magnitude of the emphasis or de-emphasis may be greater for a first clock speed than a second clock speed when the second clock speed is slower than the first clock speed due to the decreased amount of time for transmissions. In some examples, CTRL2 signal that controls the magnitude of the emphasis or de-emphasis applied by the pre-conditioning magnitude control circuit 524 may be provided from the mode register. The preconditioned signal provided from the pre-conditioning magnitude control circuit 524 may be provided to a node P4B coupled to the node P1B.

Figure 6:
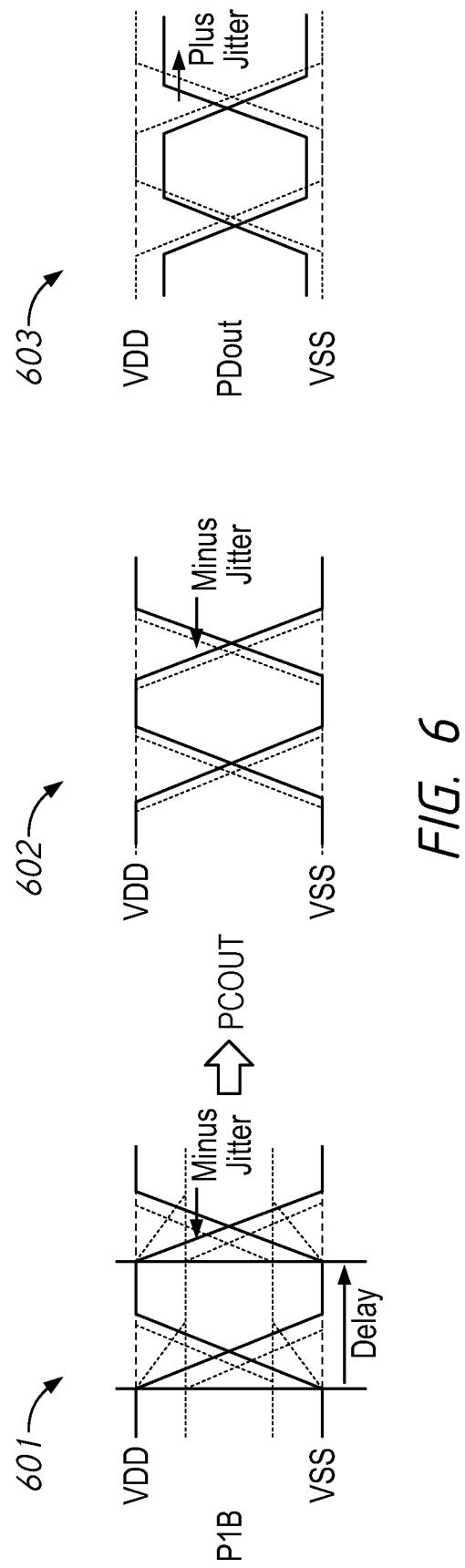
FIG. 6 includes example depictions of example jitter waveform plots associated with the preconditioning circuit, in accordance with embodiments of the disclosure.

In addition, the data terminals DQ may be affected by signal jitter. In some examples, the circuitry of each of the pre-conditioning magnitude control circuit 524 and the pre-conditioning timing control circuit 526 may be implemented such that they introduce a jitter waveform that is inverse to a jitter waveform introduced at the external data terminals. For example, FIG. 6 includes example depictions of example jitter waveform plots associated with the pre-conditioning circuit, in accordance with embodiments of the disclosure. The waveforms in plots 601 and 602 are example waveforms and negative jitter applicable to a signal passing through the IO circuit 500 and the waveform in the plot 603 shows a positive jitter applied at the data terminal. The negative jitter applied by the IO circuit 500 may at least partially cancel out the positive jitter at the data terminal, in some examples.

Figure 7:
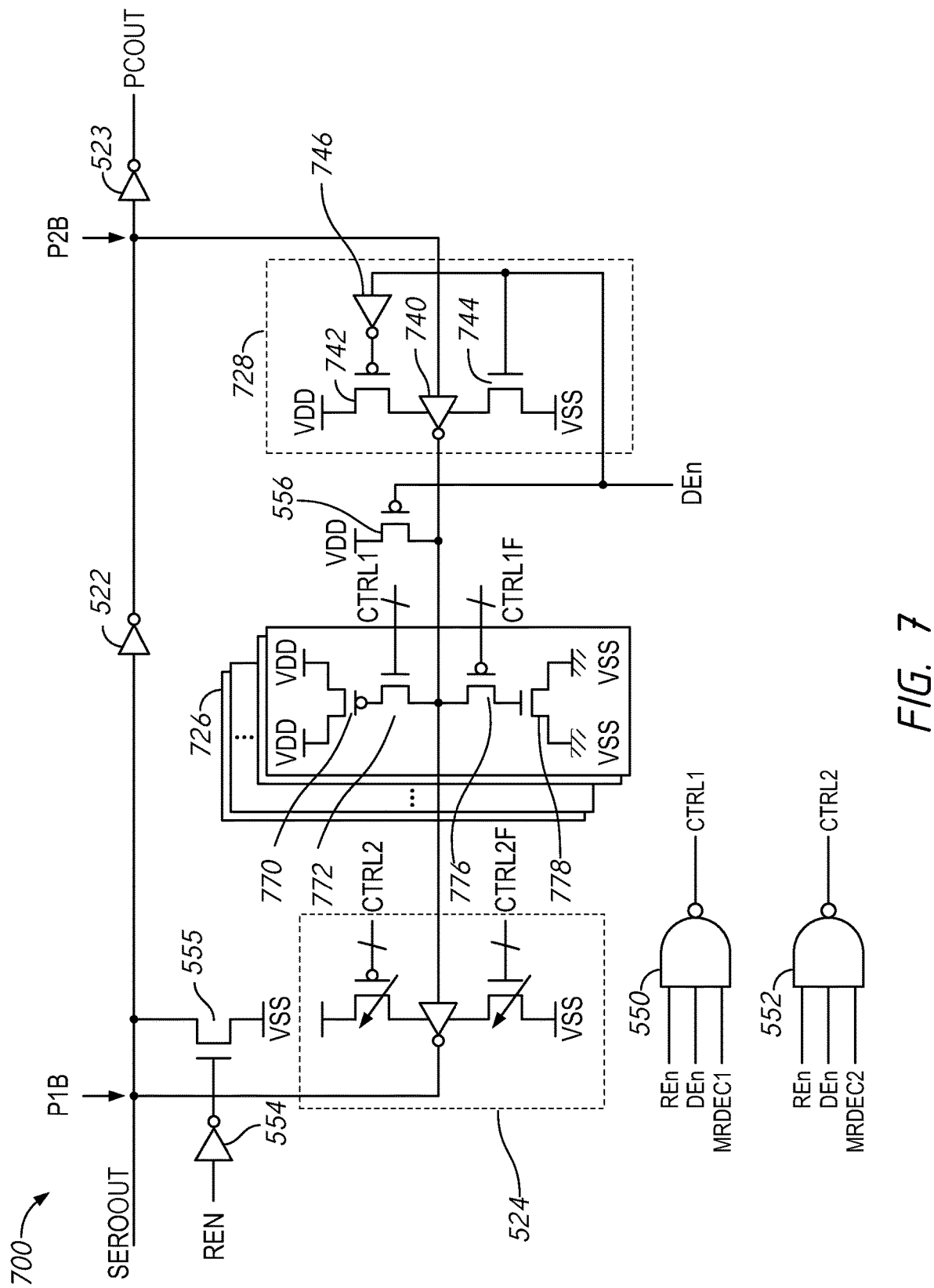
FIG. 7 is a block diagram of a pre-conditioning circuit according to an embodiment of the present disclosure.

FIG. 7 is a block diagram of a pre-conditioning circuit 700 according to an embodiment of the present disclosure. The pre-conditioning circuit 162 of FIG. 1, the pre-conditioning circuit 220 of FIG. 2, the pre-conditioning circuit 300 of FIG. 3, and/or the pre-conditioning circuit 400 of FIG. 4A may implement the pre-conditioning circuit 700, in some examples. The pre-conditioning circuit 700 may include elements that have been previously described with respect to the pre-conditioning circuit 520 of FIG. 5. Those elements have been identified in FIG. 7 using the same reference numbers used in FIG. 5 and operation of the common elements is as previously described. Consequently, a detailed description of the operation of these particular elements will not be repeated in the interest of brevity.

The pre-conditioning circuit 700 may be configured to receive SEROUT signal and to precondition the SEROUT signal to provide a preconditioned output signal PCOUT. The pre-conditioning circuit 700 may include inverters 522 and 528, a feedback loop including the pre-conditioning magnitude control circuit 524, a pre-conditioning timing control circuit 726, an inverter circuit 728, and a precharge transistor 556. Serialized output data signals SEROUT may be received at an input node P1B and may be provided to an output node P2B via the inverter 522. The SEROUT signals may be encoded with read data from a memory cell array. The preconditioned output signals PCOUT signals may be provided at an output of the pre-conditioning circuit 700 via the inverter 523.

When preconditioning is enabled via the REn (e.g., indicating a read operation) and DEn (e.g., indicating that preconditioning is enabled) control signals, the pre-conditioning magnitude control circuit 524, the pre-conditioning timing control circuit 726, and the inverter circuit 728 may be configured to precondition the SEROUT signals based on the MRDEC1 and MRDEC2 signals, respectively, to provide the PCOUT signals. The REn and DEn control signals may be provided from a command decoder (e.g., the command decoder 115 of FIG. 1) and the MRDEC1/2 signals may be provided from a mode register (e.g., the mode register 116 of FIG. 1).

In operation, the transfer of data from the pre-conditioning circuit 700 to the data terminals may occur at high speeds. When no read operation is taking place, the discharge transistor 555 may discharge the P1B node to a low logical value (e.g., the VSS voltage) in response to the REn signal inverted via the inverter 554. In addition, when the preconditioning is disabled via the DEn signal, the inverter circuit 728 may be disabled (e.g., by disabling transistors 742 (via inverter 746) and transistor 744), and the precharge transistor 556 may be enabled to precharge the P3B node to a high logical value (e.g., the VDD voltage), and the NAND gates 550 and 552 may be configured to disable the preconditioning timing control circuit 726 and the pre-conditioning magnitude control circuit 524, respectively, by disabling respective transistors in each of the pre-conditioning timing control circuit 726 (e.g., transistors 772 and 776) and the pre-conditioning magnitude control circuit 524.

During a read operation with preconditioning (e.g., the DEn and REn signals are active), the pre-conditioning circuit 700 may be configured to precondition the SEROUT signals for consumption by downstream circuitry in high-throughput applications to improve reliability of and reduce power consumption for transmission of the serialized read data to each data terminal. As part of the preconditioning, the pre-conditioning timing control circuit 726 may control timing (e.g., an amount of delay) of application of the signal preconditioning to the signal and the pre-conditioning magnitude control circuit 524 may control a magnitude of the preconditioning (e.g., an amount of emphasis or de-emphasis) applied to the signal. The pre-conditioning magnitude control circuit 524 and the pre-conditioning timing control circuit 726 may be implemented using a feedback loop that preconditions a current value of the SEROUT signals at the P1B node based at least in part on a current value of signals at the P2B node. The value at the P2B node may include an inverted version of the preceding value of the SEROUT signals at the P1B node.

When the DEn signal is active, the inverter 740 of the inverter circuit 728 may be enabled (e.g., by enabling the transistors 742 (via inverter 746) and transistor 744), to invert the value at the P2B node for provision to the pre-conditioning timing control circuit 726. The pre-conditioning timing control circuit 726 may be configured to selectively set or adjust an amount of delay applied in the feedback loop between the P2B node and the P1B node based on the MRDEC1 signal provided to the pre-conditioning timing control circuit 726 as the CTRL1 (and complementary active-low CTRL1F) signals via the NAND gate 550. To adjust the amount of delay, the CTRL1/CRTL1F signals may control a gate voltage of the transistors 772 and 776, respectively, which may affect a capacitance created by the transistors 770 and 778. The amount of capacitance may affect propagation of the signal from the inverter circuit 728 to the pre-conditioning magnitude control circuit 524. The source and drain of the transistor 770 may be coupled to a first voltage source VDD and the gate may be coupled to the transistor 772 and the source and drain of the transistor 778 may be coupled to the second voltage source VSS and the gate may be coupled to the transistor 776. The CTRL1/CTRL1F control signals may be configured to adjust a delay through the pre-conditioning timing control circuit 726 by controlling a capacitance of the pre-conditioning timing control circuit 726 based on a gate voltage of the first and second transistors 772 and 776. In some examples, the CTRL1/CTRL1F control signal magnitudes may be adjusted to adjust a speed of transition of a signal through the pre-conditioning timing control circuit 726, in one embodiment. In some examples, the pre-conditioning timing control circuit 726 may include multiple ones of the capacitors coupled in parallel along the signal path. The amount of delay applied by the pre-conditioning timing control circuit 726 may be set based on a clock speed of the data transmission. In some examples, the delay may be set to approximate a width of one unit of information (e.g., width of one data bit transmitted on the signal line). The CTRL1/CTRL1F control signals may be set in the mode register, and may be based on a clock speed designated for an output data bus.

The pre-conditioning magnitude control circuit 524 may be configured to selectively set or adjust a magnitude of the emphasis or de-emphasis applied in the feedback loop between the P2B node and the P1B node, as described with reference to FIG. 5.

In addition, the data terminals DQ may be affected by signal jitter. In some examples, the circuitry of each of the pre-conditioning magnitude control circuit 524 and the pre-conditioning timing control circuit 726 may be implemented such that they introduce a jitter waveform that is inverse to a jitter waveform introduced at the external data terminals.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a serializer circuit configured to receive a block of read data and to serialize the block of read data to provide a serialized output data signal encoded with the read data; and
   a preconditioning circuit configured to receive the serialized output data signal at an input node and to precondition the serialized output data signal to provide a pre-conditioned output signal at an output node coupled to a pre-driver circuit, wherein the pre-conditioning circuit includes a forward path from the input node to the output node and a feedback path from the output node to the input node, wherein the feedback path include a feedback circuit configured to independently control both of a propagation delay and a magnitude of emphasis/de-emphasis applied to a signal at the input node.

2. The apparatus of claim 1, wherein the feedback circuit is configured to set the propagation delay between the output node and the input node based on a data transmission clock speed provided by the pre-driver circuit.

3. The apparatus of claim 2, wherein the feedback circuit is configured to set the propagation delay between the output node and the input node based on a mode register setting indicating the data transmission clock speed provided by the pre-driver circuit.

4. The apparatus of claim 1, wherein the feedback circuit is configured to set the magnitude of emphasis/de-emphasis applied to the signal at the input node based on a data transmission clock speed provided by the pre-driver circuit.

5. The apparatus of claim 4, wherein the feedback circuit is configured to set the magnitude of emphasis/de-emphasis applied to the signal at the input node based on a mode register setting indicating the data transmission clock speed provided by the pre-driver circuit.

6. The apparatus of claim 1, wherein the feedback circuit includes a magnitude control circuit configured to control the magnitude of emphasis/de-emphasis applied to the signal at the input node.

7. The apparatus of claim 6, wherein the magnitude control circuit comprises a first configurable transistor circuit coupled between a first voltage source and an inverter and a second configurable transistor circuit coupled between a second voltage source and the inverter, wherein the first and second configurable transistor circuits are controlled based on a mode register setting associated with a data transmission clock speed.

8. The apparatus of claim 6, wherein the feedback circuit further comprises a timing control circuit configured to control the propagation delay between the output node and the input node.

9. The apparatus of claim 8, wherein the timing control circuit comprises a first configurable transistor circuit coupled between a first voltage source and an inverter and a second configurable transistor circuit coupled between a second voltage source and the inverter, wherein the first and second configurable transistor circuits are controlled based on a mode register setting associated with a data transmission clock speed.

10. The apparatus of claim 8, wherein the timing control circuit comprises a configurable capacitor circuit configured to control the propagation delay between the output node and the input node based on a mode register setting associated with a data transmission clock speed.

11. An apparatus comprising:
an input node configured to receive a serialized data signal;
an output node coupled to the input node via an inverter and configured to provide a preconditioned serialized data signal based on the serialized data signal; and
a feedback circuit coupled between the output node and the input node, wherein the feedback circuit is configured to independently control both of a propagation delay between the output node and the input node and a magnitude of emphasis/de-emphasis applied to a signal at the input node based on a data transmission clock speed.

12. The apparatus of claim 11, wherein the feedback circuit is configured to receive a mode register code indicating the data transmission clock speed.

13. The apparatus of claim 11, wherein the feedback circuit includes a magnitude control circuit configured to control the magnitude of emphasis/de-emphasis applied to the signal at the input node.

14. The apparatus of claim 13, wherein the magnitude control circuit comprises a first configurable transistor circuit coupled between a first voltage source and an inverter and a second configurable transistor circuit coupled between a second voltage source and the inverter, wherein the first and second configurable transistor circuits are controlled based on a mode register setting associated with a data transmission clock speed.

15. The apparatus of claim 13, wherein the feedback circuit further comprises a timing control circuit configured to control the propagation delay between the output node and the input node.

16. The apparatus of claim 15, wherein the timing control circuit comprises a first configurable transistor circuit coupled between a first voltage source and an inverter and a second configurable transistor circuit coupled between a second voltage source and the inverter, wherein the first and second configurable transistor circuits are controlled based on a mode register setting associated with a data transmission clock speed.

17. The apparatus of claim 15, wherein the timing control circuit comprises a configurable capacitor circuit configured to control the propagation delay between the output node and the input node based on a mode register setting associated with a data transmission clock speed.

18. A method comprising:
receiving, at an input node of a preconditioning circuit of a semiconductor device, a serialized data signal encoded with data;
providing, from an output node of the preconditioning circuit, a pre-conditioned output signal; and
in response to a preconditioning operation being enabled:
delaying propagation of an emphasis/de-emphasis signal from the output node to the input node through a feedback circuit of the preconditioning circuit based on a data transmission clock speed; and
after delaying propagation of the emphasis/de-emphasis signal from the output node to the input node, adjusting a magnitude of the emphasis/de-emphasis signal received from the output node for provision to the input node based on the data transmission clock speed, wherein the preconditioned output signal is provided based on serialized data signal and the emphasis/de-emphasis signal.

19. The method of claim 18, further comprising delaying propagation of the emphasis/de-emphasis signal based on a mode register setting.

20. The method of claim 18, further comprising enabling the preconditioning in response to receipt of an enable signal from a command decoder of the semiconductor device.

21. The method of claim 18, further comprising delaying propagation of the emphasis/de-emphasis signal from the output node to the input node via a configurable capacitor circuit of the feedback circuit.

22. The method of claim 18, further comprising delaying propagation of the emphasis/de-emphasis signal from the output node to the input node via a configurable inverter circuit of the feedback circuit.

23. The method of claim 18, further comprising adjusting the magnitude of the emphasis/de-emphasis signal received from the output node via a configurable inverter circuit of the feedback circuit.

* * * * *

UNITED STATES PATENT AND TRADEMARK OFFICE
CERTIFICATE OF CORRECTION

PATENT NO. : 11,955,166 B2
APPLICATION NO. : 17/749563
DATED : April 9, 2024
INVENTOR(S) : Atsushi Mamba et al.

It is certified that error appears in the above-identified patent and that said Letters Patent is hereby corrected as shown below:

In the Claims

| Column | Line | Claim | Reads | Should Read |
|---|---|---|---|---|
| 16 | 59 | 1 | pre-conditioned output signal | preconditioned output signal |
| 16 | 60 | 1 | wherein the pre-conditioning circuit | wherein the preconditioning circuit |
| 18 | 32 | 18 | a pre-conditioned output signal | a preconditioned output signal |

Signed and Sealed this
Eighteenth Day of June, 2024

Katherine Kelly Vidal
*Director of the United States Patent and Trademark Office*